United States Patent
Gault

(10) Patent No.: US 9,628,607 B2
(45) Date of Patent: Apr. 18, 2017

(54) MOBILE TELEPHONE ADAPTABLE TO A RESTRICTED-ACCESS AREA AND OPERATING CELL OF SUCH TELEPHONE

(71) Applicant: Jean-Francois Gault, Margency (FR)

(72) Inventor: Jean-Francois Gault, Margency (FR)

(73) Assignee: SATCOM1 APS, Greve (DK)

( * ) Notice: Subject to any disclaimer, the term of this patent is extended or adjusted under 35 U.S.C. 154(b) by 0 days.

(21) Appl. No.: 14/367,461

(22) PCT Filed: Dec. 19, 2012

(86) PCT No.: PCT/EP2012/076066
§ 371 (c)(1),
(2) Date: Jun. 20, 2014

(87) PCT Pub. No.: WO2013/092651
PCT Pub. Date: Jun. 27, 2013

(65) Prior Publication Data
US 2015/0304482 A1    Oct. 22, 2015

(30) Foreign Application Priority Data
Dec. 22, 2011   (FR) ...................... 11 62274

(51) Int. Cl.
| | |
|---|---|
| H04M 1/66 | (2006.01) |
| H04M 1/725 | (2006.01) |
| H03F 1/02 | (2006.01) |
| H04B 1/04 | (2006.01) |
| H04W 4/02 | (2009.01) |
| H04W 52/28 | (2009.01) |

(52) U.S. Cl.
CPC ...... H04M 1/72577 (2013.01); H03F 1/0277 (2013.01); H04B 1/0475 (2013.01); H04M 1/72572 (2013.01); H04W 4/021 (2013.01); H04W 52/285 (2013.01); Y02B 60/50 (2013.01)

(58) Field of Classification Search
CPC ... H04W 48/04; H04W 48/02; H04W 52/325; H04W 52/34; H04W 52/244; H04W 52/283
USPC .......................................................... 455/410
See application file for complete search history.

(56) References Cited

U.S. PATENT DOCUMENTS

| | | | | |
|---|---|---|---|---|
| 6,011,973 | A * | 1/2000 | Valentine | H04W 48/04 342/357.59 |
| 6,832,093 | B1 * | 12/2004 | Ranta | H04W 48/04 455/422.1 |
| 2002/0019219 | A1 | 2/2002 | Doherty | |
| 2004/0203667 | A1 * | 10/2004 | Schroeder | H04W 48/04 455/414.1 |
| 2009/0006677 | A1 | 1/2009 | Rofougaran | |
| 2010/0291888 | A1 | 11/2010 | Hadjichristos et al. | |

FOREIGN PATENT DOCUMENTS

GB   2 353 672   2/2001

OTHER PUBLICATIONS

International Search Report dated Apr. 3, 2013, corresponding to PCT/EP2012/076066.

* cited by examiner

*Primary Examiner* — Kwasi Karikari
(74) *Attorney, Agent, or Firm* — Young & Thompson

(57) ABSTRACT

A mobile telephone adaptable to a restricted-access area includes an RF transmitter which is intended to operate in a restricted-access area. It further includes a reduced-power transmission element (9, 10, 13; 22-25) which can be activated instead of the full-power transmitter (7). An operating cell of such telephones is also described.

8 Claims, 1 Drawing Sheet

MOBILE TELEPHONE ADAPTABLE TO A RESTRICTED-ACCESS AREA AND OPERATING CELL OF SUCH TELEPHONE

TECHNICAL DOMAIN OF THE INVENTION

The invention relates to a mobile telephone adaptable to a restricted-access area. It also relates to an operating cell of such telephones.

PRIOR ART

Telephones which are portable, also known as mobile telephones or other telephones, are known in the prior art. These telephones can be portable and can be connected in a contactless manner or via a cable to a telecommunications network, directly, for example by a base station, or indirectly via a data network such as an Internet network. Such telephones can, in particular, be equipped with hardware and software resources in order to connect to a cellular telephony network, such as the "GSM" network.

Such mobile telephones are equipped with radiofrequency (RF) transmitters which are generally provided to reach base stations at distances of at least several hundreds of meters. This corresponds to transmission power levels which are not permitted in certain restricted-access areas such as, for example, a hospital or an executive aircraft or airliner cabin. It must be noted that the term telephone is used here to mean a device which is connectable to a telephony network even if it concerns not only a telephone but also, for example, a tablet, a personal data assistant or any other terminal performing, for example, other functions, simultaneously or otherwise with the simple telephony function. Similarly, the telephone is mobile in that it is used, at least during a fraction of the duration of its normal use, without electrical contact via cable with a docking station or a different telephony terminal.

In the prior art, it is the responsibility of the mobile telephone user to switch off his mobile telephone when he enters a restricted-access area. In return, the user can no longer access the cellular telephony network and, because this network has recently converged with other digital networks comprising the Internet, the user is constrained, for the duration of his stay in the restricted-access area, to forego these resources.

This causes an inconvenience and a loss of working means, for example during long-haul flights.

Solutions exist to overcome these disadvantages, but they have the disadvantage of using expensive techniques which are difficult to implement, because they must use certifications in various domains, such as the aeronautical domain.

BRIEF SUMMARY OF THE INVENTION

The present invention in fact proposes a mobile telephone comprising a full-power RF transmitter which is intended to operate in a restricted-access area, characterised in that it comprises a reduced-power transmission means which can be activated instead of the full-power RF transmitter.

According to other characteristics of the telephone:
the reduced-power transmission means comprises an input port intended to receive an activation signal when the mobile telephone enters the restricted-access area;
the reduced-power transmission means comprises a reduced-power transmitter connected to a transmit antenna via a switch controlled by the activation signal when the mobile telephone enters the restricted-access area;
the reduced-power transmission means comprises a gain amplifier controlled by a control word generated by the activation signal when the mobile telephone enters the restricted-access area;
the reduced-power transmission means comprises a transmission line disposed between the output of the full-power RF transmitter and an RF antenna which can be shunted by a switch controlled by the activation signal when the mobile telephone enters the restricted-access area;
the activation signal is generated by an application run on the mobile telephone under the control of a mobile telephone user;
the application run on the mobile telephone comprises a user interface intended to be actuated by the mobile telephone user;

The invention also proposes an operating cell of mobile telephones implemented according to the preceding description and equipped with reduced-power transmission means. The cell comprises means intended to receive telephony signals at reduced power from various mobile telephones activated in the restricted-access area in which the operating cell is active, means for transmitting control signals and telephony signals to each of the mobile telephones activated in the restricted-access area, and means for communicating with at least one telephony network which the mobile telephones activated in the restricted-access area access or are accessed by from outside the restricted-access area.

According to other characteristics of the cell:
the operating cell interworks with means for signaling to a mobile telephone and/or to its user that it is accessing a restricted-access area;
the operating cell interworks with means for distributing applications which can be run on a mobile telephone in order to activate its reduced-power transmission means.

BRIEF DESCRIPTION OF THE FIGURES

Other characteristics and advantages of the present invention will be better understood from the description which follows, with reference to the attached drawings, in which.

DETAILED DESCRIPTION OF THE FIGURES

Figure 1:
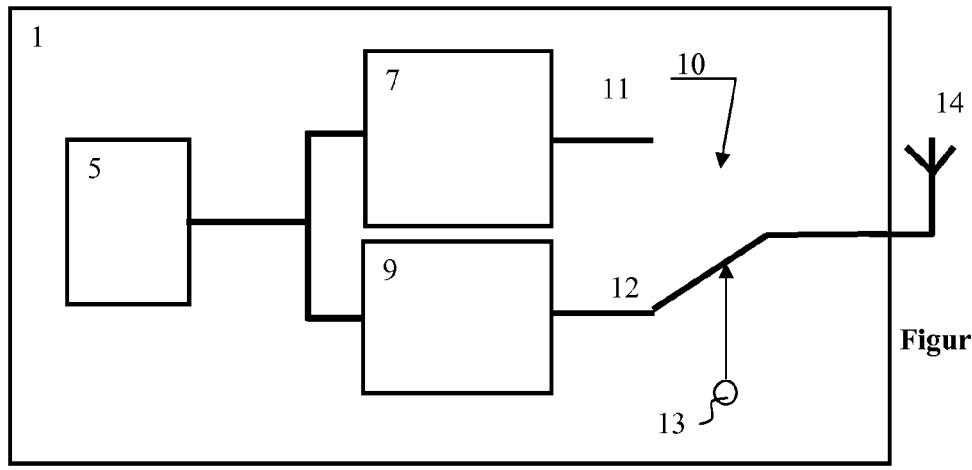
FIG. 1 is a schematic view of a mobile telephone according to the invention.

FIG. 1 shows a mobile telephone according to one embodiment of the invention. The mobile telephone 1 is, for example, manufactured according to the standard known as "GSM". Other techniques are possible, also comprising non-cellular telephones, telephones notably of the 3GPP standard or other standards and other communicating electronic devices of the "Personal Electronic Devices" (PED) type.

In the mobile telephone 1 of the embodiment shown in FIG. 1, a circuit 5 comprises means for receiving and producing telephony control signals (not shown) and means for exchanging telephony speech signals (not shown) which are connected to a loudspeaker and to a microphone to allow a conventional telephony dialogue.

The circuit 5 also comprises a telephony modem electrically connected to a transmission circuit belonging to a full-power RF transmitter 7 as known in the prior art. This full-power transmission circuit is connected via its output to an antenna 14 which allows the mobile telephone to exchange RF signals with a base station in a telephony cell as is known.

As previously described, areas exist in which mobile telephones, such as the telephone 1, must not transmit because their transmission power may, under certain conditions, cause malfunctions of other safety equipment. This is notably the case in aircraft cabins in which or near to which electrical equipment is located, the operation of which must not in any event be interfered with by the operation of a mobile telephone. In such a restricted-access area, active mobile telephones must always be switched off.

However, when the power radiated by a mobile telephone was lower than a given threshold, it was discovered that the risk of malfunction of the nearby electrical equipment was reduced below the threshold requiring the mobile telephones to be switched off. The invention proposes a mobile telephone 1 having a reduced-power transmission means. The reduced-power transmission means comprises a second, reduced-power RF transmitter 9 suitable for operating instead of the first full-power RF transmitter 7. The second RF transmitter 9 has an amplifier to produce a reduced transmission power below the threshold of power tolerated in the restricted-access area in which the mobile telephone 1 is intended to operate at least temporarily.

The second RF transmitter 9 provides an example of a reduced-power transmission means within the meaning of the invention.

For this purpose, a switch 10 is connected between the first 7 and second 9 RF transmitters and the transmit antenna 14 of the mobile telephone, the switching of which is controlled by a control circuit 13 intended to receive an activation signal when the mobile telephone enters the restricted-access area.

In one variant, instead of comprising a second, reduced-power RF transmitter 9 and a controlled switch 10, the reduced-power transmission means of the invention uses an amplification circuit of the full-power RF transmitter. This amplification circuit is a variable-gain and controlled circuit. It is preferably disposed at the output of the full-power RF transmitter 7. It is programmable by a control word received from a transmission controller within the mobile telephone, which will be described below with reference to FIG. 2. The control word is generated on reception of an activation signal when the mobile telephone enters the restricted-access area.

In a different embodiment, an additional transmission line is used which produces an insertion loss when it is added to the connection between the full-power transmitter 7 and the antenna 14 (FIG. 1). In fact, the standards protecting the electrical installations of certain restricted-access areas define an EIRP ("Effective Isotropically Radiated Power") which measures all of the losses introduced between the output of the amplifier and the RF antenna itself. It is then possible to add a transmission line between the output of the full-power transmitter 7 and the antenna 14 and to shunt it by means of a switch which is closed when the full power is required and which is open when the reduced power is required. In this embodiment, the additional transmission line produces a determined insertion loss.

In this embodiment, the state of the switch, open or closed, is determined by an activation signal when the mobile telephone enters the restricted-access area.

Figure 2:
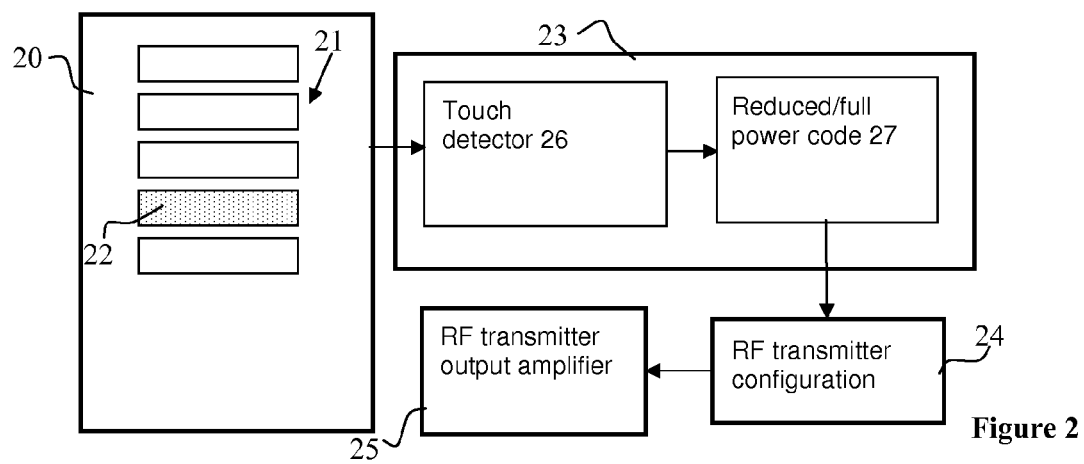
FIG. 2 shows a means for activating the mobile telephone according to the invention.

FIG. 2 shows a means for activating the mobile telephone in a particular embodiment implementing a user interface. The user interface of the mobile telephone comprises a touch screen 20 on which a configuration menu 21 of the mobile telephone is displayed, in a manner known per se. The configuration menu 21 comprises a plurality of items and notably, according to the invention, an item 22 which carries a mark recognisable as a literal command in alphanumeric characters or an icon. The item 22 is activated by touch (the touched item is then marked as shaded in FIG. 2).

The touched item 22 launches the running of an application 23 recorded in the memory of the mobile telephone. The application run comprises a touch detector 26 which activates a module to supply in response a reduced or full transmission power configuration code according to the preceding state of the application. The power code is then addressed by the controller of the mobile telephone to a configuration circuit 24 of the RF transmitter which then adjusts the gain of the output amplifier 25 of the RF transmitter of the mobile telephone in a known manner.

In one embodiment, the reduced-power transmission means comprises a resource allowing the power which the mobile telephone or other communicating personal electronic device transmits to be controlled from outside the mobile telephone, for example from the transmission infrastructure managed by the telephony service provider or other service provider. In this embodiment, it is possible for two contradictory commands to originate from outside the mobile telephone and from the mobile telephone user respectively. This is a situation which may arise when the restricted-access area is located in a cell of a cellular telephony network, for example in the case of an aircraft on the ground.

According to one characteristic of the invention, the mobile telephone is equipped with a resource allowing the origin of the command to be detected and a determined priority to be allocated to each of the origins of commands to set reduced transmission power or to set full transmission power. Priority is preferably given to the origin of the command originating from the mobile telephone user. In the application of the invention which relates to the aeronautical domain, or any other domain requiring a certification of the hardware and resources allowing a radio frequency transmitter device to be switched to a reduced radiated power mode, the fact of assigning the power reduction command to a device or process outside the mobile telephone requires it to be certified by a certification authority which, as explained in the introduction, incurs costs and creates manufacturing difficulties which the present invention avoids because the origin of the command is under the authority of the mobile telephone user.

Figure 3:
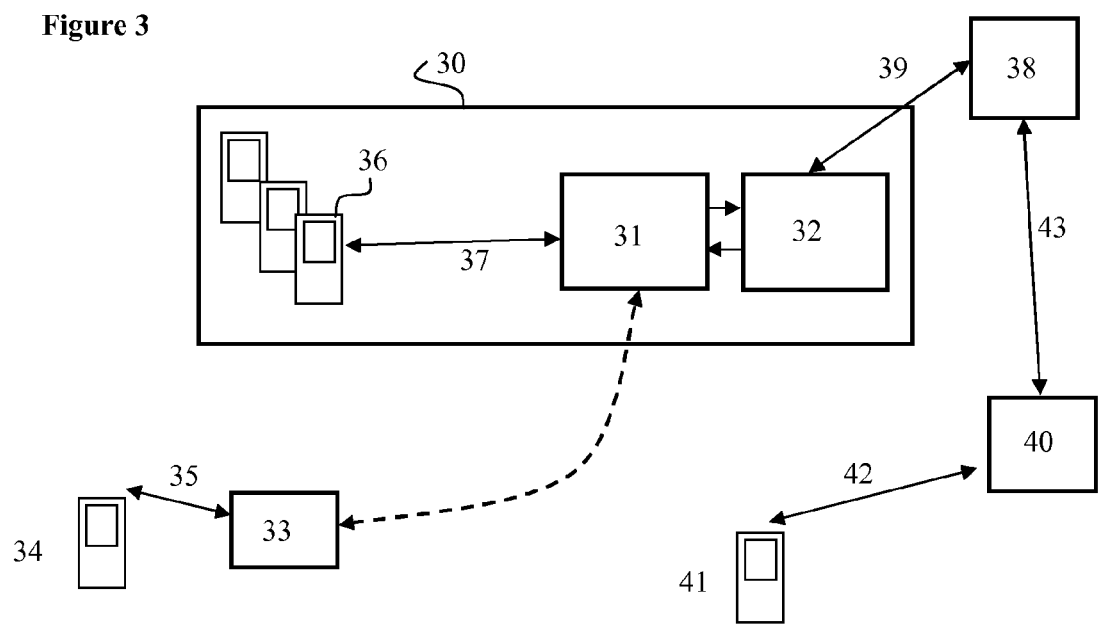
FIG. 3 is a diagram explaining the structure of an operating cell according to the invention.

FIG. 3 shows a diagram explaining an operating cell.

The operating cell operates within a restricted-access area. In the example embodiment which will be described, this involves the cabin 30 of an aircraft transporting passengers, some of whom are equipped with mobile telephones 36 according to the invention.

The operating cell comprises a base station 31 which communicates via RF waves 37 with the plurality of mobile telephones 36 installed within the area 30. The base station 31 is identical to a normal base station for operating a mobile telephony cell, but it is furthermore adapted to receive telephony signals from mobile telephones at reduced power.

According to the invention, means are provided for communication with at least one telephony network which the mobile telephones activated in the restricted-access area access or are accessed by from outside the restricted-access area.

In one example embodiment, the base station 31 is equipped with a bidirectional gateway with an interface for communication via an additional bidirectional link 39, for example with a telephony communications satellite 38. The telecommunications satellite 38 is, in one example embodiment, a satellite of the Inmarsat™ network.

The telephony communications satellite sets up a bidirectional link 43 with a gateway 40 which connects the conventional mobile telephony network 42 to conventional mobile telephones 41 disposed outside the restricted-access area 30. It is then possible for the operating cell according to the invention to manage the telephony communications between one of the mobile telephones 36 installed in the restricted-access area 30 and any one of the mobile telephones or other telephones 41 disposed outside the restricted-access area.

One advantage of the invention can be noted in that, even in the absence of a functional gateway with the interface 32, the mobile telephones 36 can remain switched on in the restricted-access area 30 and can be put to uses other than those strictly of telephony, which is advantageous when the mobile telephone is a multifunctional device, serving notably as a computer or personal data assistant.

In one embodiment, the operating cell interworks with means for signaling to a mobile telephone and/or its user that it is accessing a restricted-access area. Such a means may comprise the transmission of a short SMS message, which is then consultable by the user and is signaled to him on its arrival on the mobile telephone. The reduced power mode control application can detect such a message and activate the full-power or reduced-power output amplifier control word. However, the signaling is preferably left to the discretion of the user, who can then open the configuration or parameterisation menu of his mobile telephone (see FIG. 2) at his own initiative in order to deliberately switch his mobile telephone to reduced-power transmission mode.

In one embodiment, the operating cell interworks with means 33 for distributing applications which can be run on a mobile telephone in order to activate the reduced-power transmission means with which each mobile telephone equipped according to the invention is provided, as described in FIGS. 1 and 2.

For this purpose, the base station 31 interworks with a connection station 33, for example via the Internet 35, with a mobile telephone 34 equipped with a reduced-power transmission means which can be activated instead of the full-power transmitter. The connection station 33 allows the supply and installation of an application which can be run on the mobile telephone 34 prior to its access to the restricted-access area 30 to activate its reduced-power transmission means. The mobile telephone 34 can then be recorded in a database which can be operated for usage evaluation purposes or the like, or for charging purposes in the base station 31 of each operating cell.

The invention claimed is:

1. A mobile telephone comprising:
   a full-power RF transmitter configured to operate in a restricted-access area; and
   a reduced-power transmission system configured to be activated instead of the full-power RF transmitter, the reduced-power transmission system comprising
      an input port configured to receive an activation signal when the mobile telephone enters the restricted-access area, and
      a transmission line disposed between the output of the full-power RF transmitter and an RF antenna configured to be shunted by a switch controlled by the activation signal when the mobile telephone enters the restricted-access area.

2. The mobile telephone according to claim 1, wherein the reduced-power transmission system comprises a reduced-power transmitter connected to a transmit antenna via the switch controlled by the activation signal when the mobile telephone enters the restricted-access area.

3. The mobile telephone according to claim 1, wherein the reduced-power transmission system comprises a gain amplifier controlled by a control word generated by the activation signal when the mobile telephone enters the restricted-access area.

4. The mobile telephone according to claim 1, wherein the activation signal is generated by an application run on the mobile telephone under the control of a mobile telephone user.

5. The mobile telephone according to claim 4, wherein the application run on the mobile telephone comprises a user interface configured to be actuated by the mobile telephone user.

6. An operating cell of mobile telephones according to claim 1 and equipped with the reduced-power transmission system, the operating cell comprising:
   a receiver configured to receive telephony signals at reduced power from various mobile telephones activated in the restricted-access area in which the operating cell is active;
   a transmitter configured to transmit control signals and telephony signals to each of the mobile telephones activated in the restricted-access area;
   a communication system configured to communicate with at least one telephony network which the mobile telephones activated in the restricted-access area access or are accessed by from outside the restricted-access area.

7. The operating cell according to claim 6, wherein the operating cell interworks with a signalling system to signal to a mobile telephone and/or to a user of the mobile telephone that the mobile telephone is accessing a restricted-access area.

8. The operating cell according to claim 6, wherein the operating cell interworks with a distribution system configured to distribute applications which are configured to be run on a mobile telephone in order to activate the reduced-power transmission system.

\* \* \* \* \*